United States Patent [19]

Gentric

[11] Patent Number: 5,400,892
[45] Date of Patent: Mar. 28, 1995

[54] SELECTOR DEVICE FOR FEEDING AN OBJECT SUCH AS A SUBSTRATE TO A PROCESSING STATION

[75] Inventor: Alain Gentric, 63, rue Renan, F-22220 Treguier, France

[73] Assignee: Alain Gentric, Tergueire, France

[21] Appl. No.: 196,407

[22] Filed: Feb. 14, 1994

[30] Foreign Application Priority Data

Feb. 15, 1993 [FR] France .................. 93 01682

[51] Int. Cl.6 .............................................. B65G 47/00
[52] U.S. Cl. .............................. 198/345.2; 198/832.1
[58] Field of Search ............... 198/832.1, 345.1, 345.2, 198/345.3

[56] References Cited

U.S. PATENT DOCUMENTS

| 3,797,636 | 3/1974 | MacDonald | 198/832.1 X |
| 5,140,774 | 8/1992 | Onodera | 198/345.2 X |
| 5,182,083 | 1/1993 | Barker et al. | 198/345.2 X |

FOREIGN PATENT DOCUMENTS

2602798 2/1988 France .
93 01682 11/1993 France .
2313096 9/1974 Germany .
0061222 5/1981 Japan ............................ 198/832.1

Primary Examiner—James R. Bidwell

[57] ABSTRACT

A selector device for moving at least one object such as a substrate to a processing station includes an object-holder rotatably mounted on a support and having areas for receiving objects to be processed which can be moved successively to the processing station. A force accumulator member connected to the object-holder rotates the object-holder in one direction. An incrementer mechanism has a stop system on the support and an abutment system on the object-holder and respectively associated with the receiving areas. The stop system cooperates successively with the abutments of the abutment system to hold the object-holder at successive positions such that the receiving areas are successively located at the processing station. A trigger arrangement operates on the incrementer mechanism so that the stop system passes selectively from one abutment to the next abutment after rotation of the object-holder by the force accumulator member.

20 Claims, 5 Drawing Sheets

SELECTOR DEVICE FOR FEEDING AN OBJECT SUCH AS A SUBSTRATE TO A PROCESSING STATION

BACKGROUND OF THE INVENTION

1. Field of the Invention

This invention concerns a selector device for feeding an object such as a substrate to a processing station.

The device of the invention finds a particular application in vacuum deposition installations for producing thin optical, electronic or opto-electronic films for surface treatment of optical fibers and associated components such as transmitters, receivers, amplifiers, connections and switches.

2. Description of the Prior Art

At present to process substrates in a vacuum enclosure the enclosure is provided with an airlock connected to pump means and the substrates are transferred from the airlock to the processing area within the enclosure and vice versa by means of a transfer rod. Such installations are extremely complex, large in size and not especially compatible with equipment for optically inspecting the substrates, making them particularly costly. Also, the substrate processing times are particularly long, given the various types of deposit that may be applied.

One object of the invention is to propose a selector device of relatively simple construction which can significantly increase the throughput of objects to be processed, especially if the processes are different.

SUMMARY OF THE INVENTION

The invention consists in a selector device for moving at least one object such as a substrate to a processing station, said device comprising:
- an object-holder rotatably mounted on a support and having areas for receiving objects to be processed adapted to be moved successively to said processing station,
- a force accumulator member connected to said object-holder and adapted to rotate said object-holder in one direction,
- an incrementer mechanism which has stop means on said support and abutment means on said object-holder and respectively associated with said receiving areas, said stop means being adapted to cooperate successively with said abutment means to hold said object-holder at successive positions such that said receiving areas are successively located at said processing station, and
- trigger means adapted to operate on said incrementer mechanism so that said stop means pass selectively from one abutment means to the next abutment means after rotation of said object-holder by said force accumulator member.

In a preferred embodiment of the invention the incrementer mechanism can advantageously comprise an escapement with pallets which comprises a balance-wheel pivotally mounted on said support and having two fingers adapted to cooperate alternately with abutments of said object-holder and a spring adapted to operate on said balance-wheel in order to move one of said fingers in front of one of said abutments of said object-holder, said trigger means operating against said spring in order to move the other finger in front of another abutment of said object-holder.

According to the invention, said object-holder preferably comprises a turntable at the periphery of which said abutments are disposed.

According to the invention, said force accumulator member can advantageously comprise a spiral spring connected to rotational tensioning means.

According to the invention said support can advantageously be removably mounted on a frame.

According to the invention said support and said frame preferably comprise rotational coupling means.

According to the invention said support can advantageously be rotatably mounted on a frame and the device preferably comprises drive means for rotating said support.

According to the invention said support is preferably rotatably mounted on said frame by way of rotational drive means.

In one embodiment of the invention said trigger means can comprise a mobile finger adapted to be moved on the path of a part of said arm in order to rotate said arm when said support turntable rotates.

According to the invention, the device may further comprise a removable cover mounted on said support and enclosing said incrementer mechanism, said trigger means having a part which extends through said cover.

According to the invention, at said processing station said support advantageously has at least one through-passage and said object-holder has at least one corresponding through-passage in its receiving areas.

According to the invention said object-holder and said support preferably comprise respective turntables, said turntables having eccentric parallel axes.

According to the invention, the selector device can advantageously be disposed in an enclosure and supported by the frame thereof.

According to the invention said trigger means can advantageously have a part which extends through the wall of said enclosure.

This invention can be understood more clearly from the following description of one non-limiting example of a selector device associated with a vacuum enclosure for processing objects made up of substrates in the form of wafers. This description is given by way of reference to the accompanying drawings.

DETAILED DESCRIPTION OF THE PREFERRED EMBODIMENT

Figure 1:
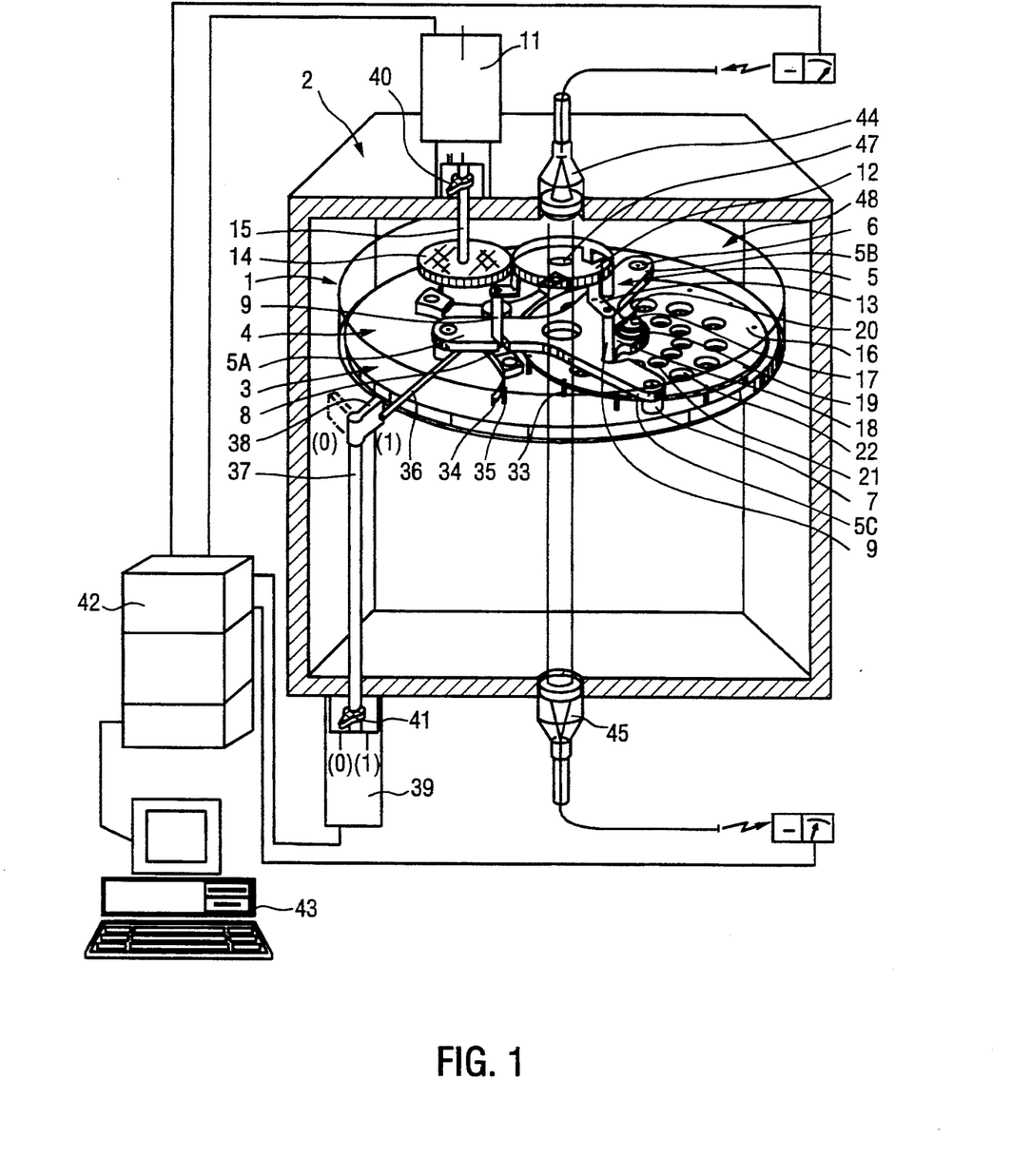
FIG. 1 is a perspective view of a selector device in accordance with the invention disposed in an enclosure.

Referring to FIG. 1, the selector device 1 shown is disposed in a processing enclosure 2.

The selector device 1 is disposed in the upper part of the enclosure 2, processing apparatus (not shown) being disposed in the lower part of the enclosure.

The selector device 1 includes a support 3 which comprises a horizontal turntable 4 and at some distance above this turntable 4 a horizontal plate 5 with three equal-length branches 5a, 5b and 5c disposed at 120°. The extremities of these branches, which are near the edge of the turntable 4, are fixed to the latter by three screws 6, three spacers 7 being disposed around the screws 6, between the plate 5 and the turntable 4. The screws 6 are disposed at 120° relative to the center of the turntable 4 and at a small distance from its edge.

The branches of the plate 5 have notches 8 into which can be inserted upon rotation of the turntable 4 about the vertical axis the lower parts of three suspension columns 9 which have annular shoulders 9a at the bottom which engage in the notches 8 and on which the horizontal plate 5 bears.

Figure 5:
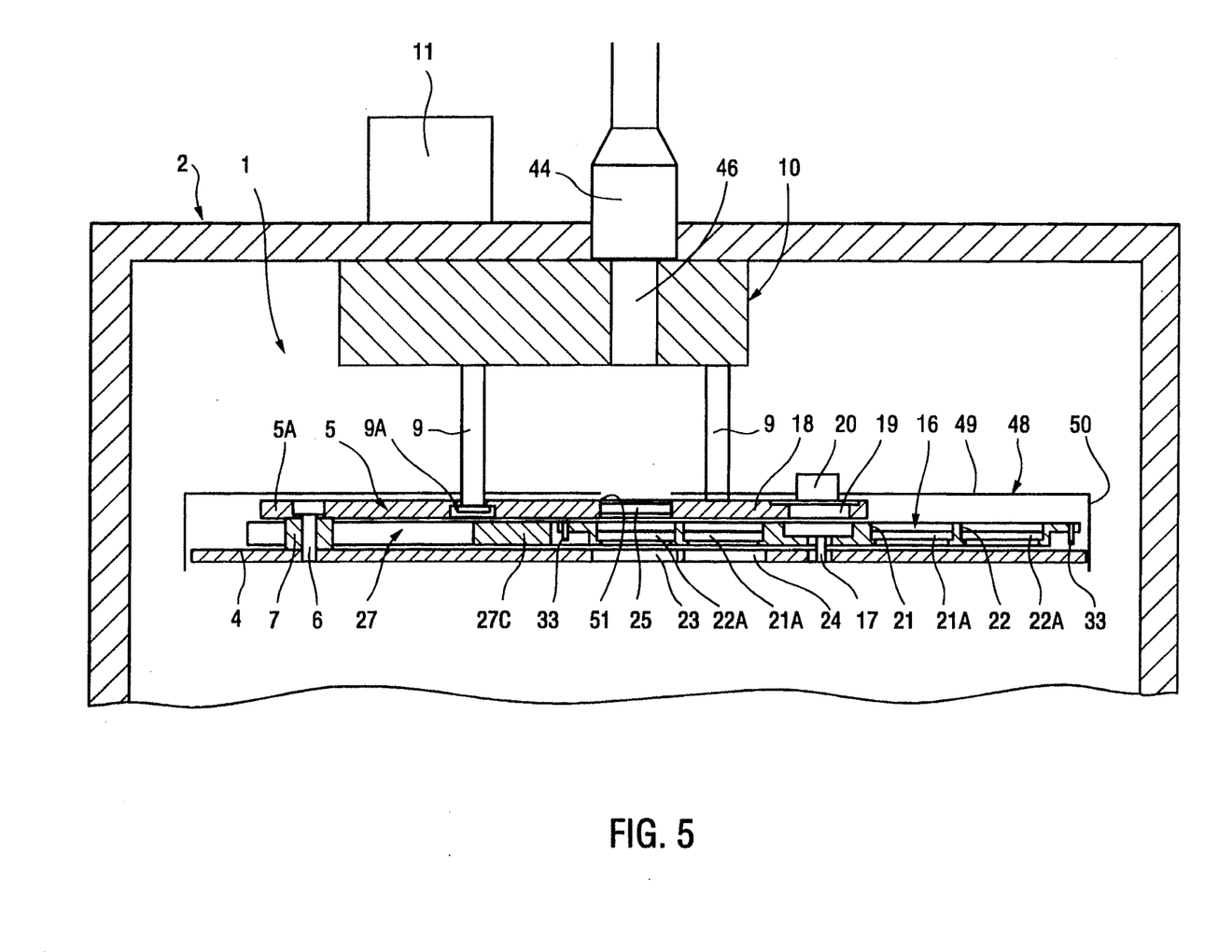
FIG. 5 shows the selector device from FIG. 1 in vertical cross-section. The pictured vertical cross-section is along the line V—V as it is indicated in FIG. 2.

As shown diagrammatically in FIG. 5, the upper parts of the columns 9 are mounted on a drive mechanism 10 inside the enclosure 2 and fixed to its upper wall. The drive mechanism 10 is coupled to an electric motor 11 outside the enclosure 2 and also fixed to its upper wall.

Referring to FIG. 1, the drive mechanism 10 can comprise, mounted in a casing, a first hollow toothed wheel 12 concentric with the turntable 4 and having at its periphery and on its lower side three lugs 13 to which the upper ends of the columns 9 are fixed and a second toothed wheel 14 fixed to the lower end of the drive shaft 15 of the electric motor 11.

The selector device 1 further comprises a wafer-holder constituted by a horizontal turntable 16 disposed between the horizontal turntable 4 and the horizontal plate 5 at a distance from the upper side of the turntable 4.

The turntable 16 is fixed to a vertical shaft 17 whose lower end is carried by the turntable 4 and whose upper end is carried by a part 18 of the plate 5 projecting horizontally between the branches 5b and 5c of the latter. The projecting part 18 constitutes a short fourth branch opposite the branch 5a.

The shaft 17 is connected to the plate 5 by a force accumulator member 19 constituted by a spiral spring and a non-return winding mechanism which has an operating knob 20, for example.

In this example the diameter of the turntable 16 is substantially equal to 0.6 times the diameter of the turntable 4, the peripheral edge of the turntable 16 being substantially tangential to the edge of the turntable 4.

The turntable 16 therefore extends under the branches 5b and 5c of the plate 5, between the spacers which carry these branches, and under the central part of this plate.

Figure 2:
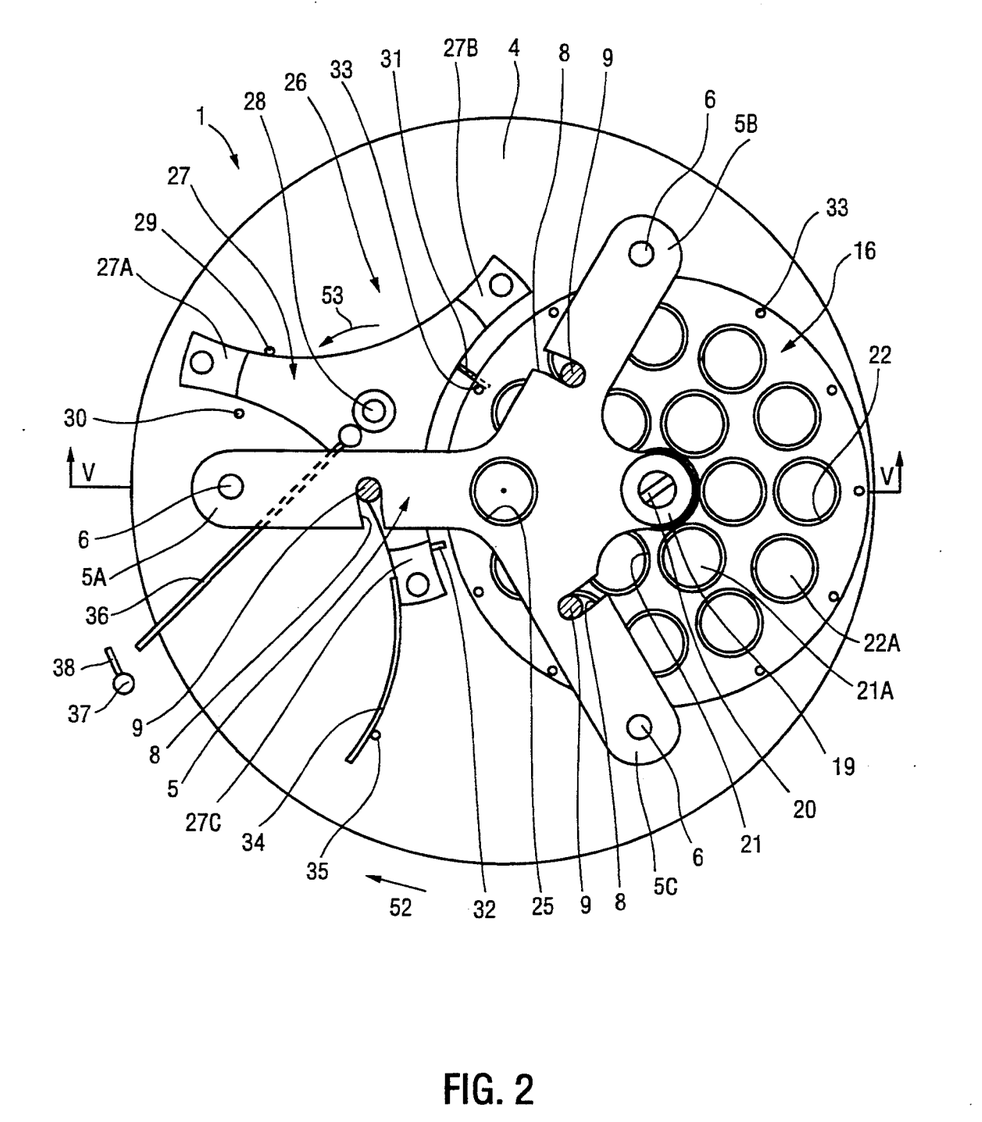
FIG. 2 is a plan view of the selector device from FIG. 1 in a vacuum enclosure in a processing position.
Figure 3:
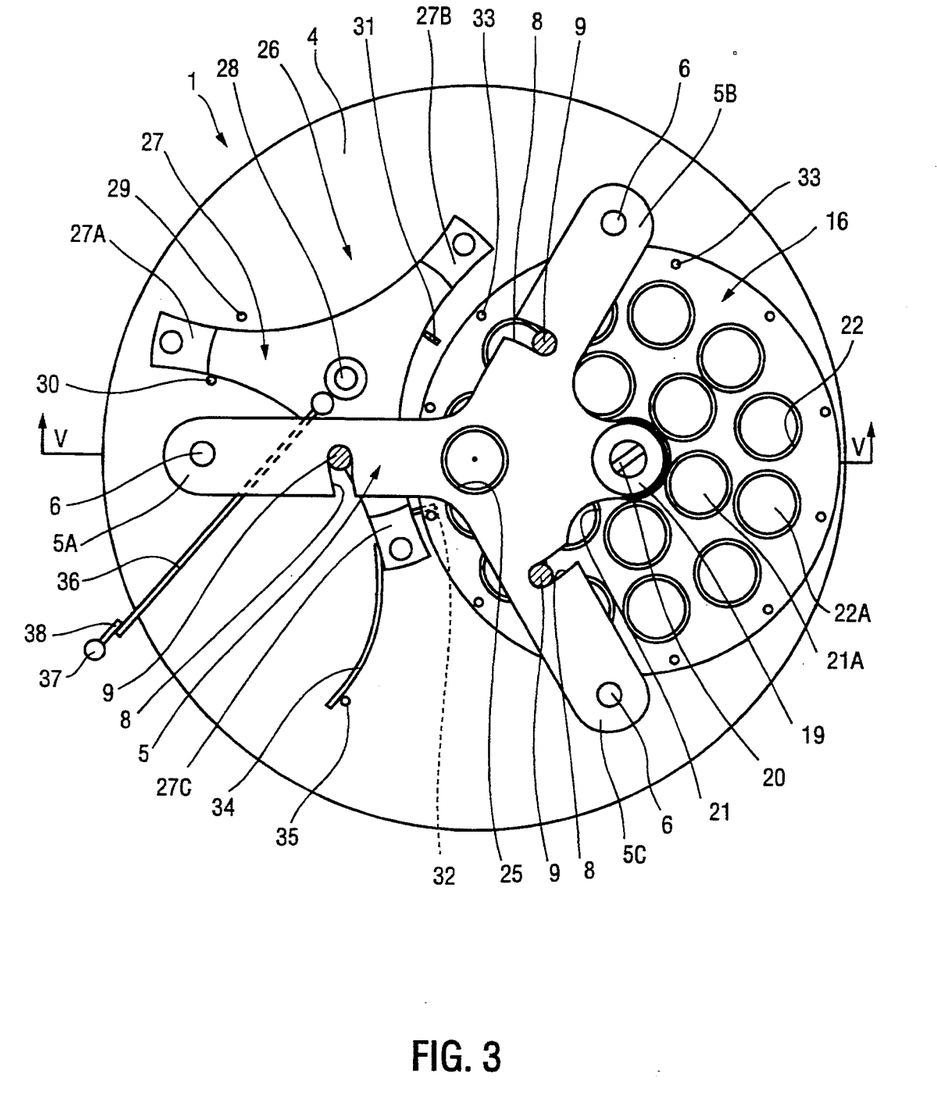
FIG. 3 is a plan view of the selector device from FIG. 1 in an incrementing position.
Figure 4:
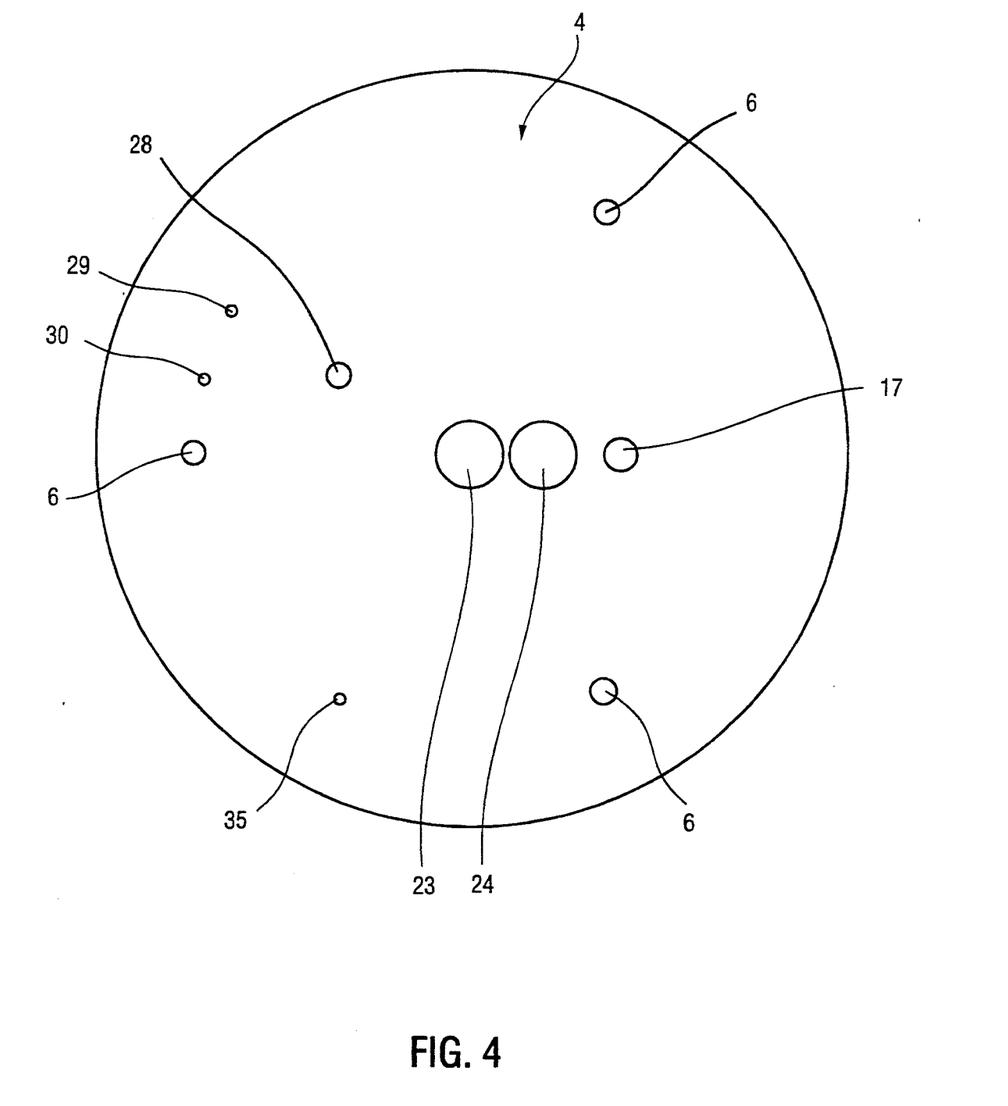
FIG. 4 is a plan view of the support turntable of the aforementioned selector device.

The turntable 16 has wafer receiving areas which in this example are two concentric rows of through-passages 21 and 22. In the example as shown in FIGS. 2 and 3 the inner row has six through-passages 21 and the outer row has twelve through-passages 22 which are equiangularly spaced, the through-passages 21 being on the same radius as a respective six through-passages 22 of the outer row.

The through-passages 21 and 22 include, for example, shoulders or studs so that circular wafers 21a and 22a may be placed in them from above and held in place.

The central part of the turntable 4 has a through-passage 23 with which the through-passages 22 of the aforementioned outside row may be aligned in succession by rotation of the turntable 16. It also has a through-passage 24 between the through-passage 23 and the shaft 17 of the turntable 16 and with which the passages 21 of the aforementioned inner row may be successively aligned. The central part of the horizontal plate 5 has a through-passage 25 in corresponding relationship to the central passage 23 of the turntable 4.

The selector device further comprises a triggered incrementer mechanism 26.

This mechanism 26 comprises an escapement with pallets comprising a star-shape horizontal balance-wheel 27 with three branches 27a, 27b and 27c disposed at 120°. The central part of the balance-wheel 27 is carried by a vertical shaft 28 disposed to one side of the branch 5a of the plate 5 whose lower end is supported by the turntable 4. The balance-wheel 27 is so arranged that its branches 27b and 27c extend along and at a distance from the peripheral edge of the turntable 16 and its branch 27a extends outwards, but not as far as the peripheral edge of the turntable 4, its branch 27c extending under the branch 5a of the plate 5.

The balance-wheel 27 pivots between two extreme positions delimited by two projecting abutments 29 and 30 carried by the turntable 4 and on respective opposite sides of its branch 27a.

The branches 27b and 27c of the balance-wheel 27 carry fingers forming abutments 31 and 32 which extend horizontally towards the turntable 16. Under its periphery, the turntable 16 has twelve fingers forming abutments 33 in radial corresponding relationship to the through-passages 22 in the turntable 16.

When the balance-wheel 27 is at its extreme positions, the fingers 31 and 32 respectively extend over the path of the finger 33 of the turntable 16.

The balance-wheel 27 is spring-loaded by a leaf spring 34 carried by its branch 27c and which is tensioned by a stud 35 projecting from the turntable 4, the spring 34 urging the branch 27a of the balance-wheel 27 against the abutment 29, in which position the finger 31 carried by its branch 27a is on the path of the fingers 33 of the turntable 16.

The balance-wheel 27 carries an actuator arm 36 extending beyond the peripheral edge of the turntable 4. The mechanism 26 further comprises a vertical shaft 37 which extends through the lower wall of the enclosure 2 near one of its lateral walls. The other end of this shaft 37 carries a radial finger 38.

The lower end of the shaft 37 is coupled to an electrical actuator member 39 outside the enclosure 2 and adapted to rotate the shaft 37 between two extreme positions. In one of its extreme positions the finger 38 is off the path of the exterior end of the arm 36 carried by the balance-wheel 27. In its other extreme position the finger 38 is on the path of the outer end of the arm 36.

Referring to FIG. 1, the shaft 15 of the motor 11 is equipped outside the enclosure 2 with an angular position sensor 40 and the shaft 37 is equipped outside the enclosure 2 with a sensor 41 responsive to its aforementioned two extreme positions.

The motor 11, the actuator member 39 and the sensors 40 and 41 are connected to an electronic control system 42 connected to a programming unit 43.

The upper and lower walls of the enclosure 2 are respectively equipped with a control beam emitter 44 and a receiver 45 responsive to this beam, both also connected to the electronic system 42. The emitter 44 and the receiver 45 are disposed so that the beam is coaxial with the turntable 4 and passes through a vertical passage 46 shown schematically in FIG. 5 and through the through-passages 25 and 23 of the horizontal plate 5 and the turntable 4. In the example as shown in FIG. 1 the toothed wheel 12 of the drive mechanism 10 has a central passage 47 through which the aforementioned beam passes.

As shown diagrammatically in FIGS. 1 and 5, the selector device 1 comprises a protective cover 48 in the shape of an inverted cup which has a horizontal flat bottom 49 which bears on the upper side of the plate 5 and a cylindrical wall 50 which extends downwards and which surrounds the peripheral edge of the turntable 4 with a small clearance. The bottom 49 has a central passage 51 for the aforementioned beam to pass through and passages for the three columns 9 and for the knob 20 of the force accumulator unit 19.

The selector device 1 as just described operates and can be used as follows:

In the static position as shown in FIG. 2 the balance-wheel 27 is held by the spring 34 in a position such that its branch 27 bears against the abutment 29 carried by the turntable 4 and the finger 31 carried by its branch 27b is in the front of one of the fingers 33 carried by the turntable 16, this finger being pressed against the finger 31 by the force accumulator member 19.

In this position one of the through-passages 22a of the turntable 16 is aligned with the central through-passage 23 of the turntable 4 and one of the through-passages 21 of the turntable 16 may be aligned with the passage 24 of the turntable 4. The selector device 1 is then in a position for processing of the wafers 21a and 22a disposed in the through-passages 21 and 22 aligned with the through-passages 24 and 23 of the turntable 4, these passages 23 and 24 constituting a processing station.

During the processing operation, for example deposition on the lower surfaces of the wafers 21a and 22a, the support 3 constituted by the turntable 4 and the plate 5 suspended on the columns 9 can be rotated by the electric motor 11. The purpose of such rotation is to homogenize the deposit.

As deposition proceeds, the process can be monitored by means of the beam emitted by the emitter 44 and picked up by the receiver 45. For this the wafers 22a must be made from a material which is transparent to the aforementioned beam, these wafers constituting control wafers.

The trigger finger 38 being off the path of the exterior part of the arm 36 connected to the balance-wheel 27, the selector device 1 can rotate several times.

To rotate the turntable 16 to align other through-passages 21 and 22 with the through-passages 23 and 24 in the turntable 4 to process other wafers the following procedure can be adopted:

The actuator member 39 is activated in order to move the finger 38 carrying the vertical shaft 37 onto the path of the outer end of the arm 36 carried by the balance-wheel 27. The support 3 is rotated by actuating the motor 11 in the direction of the arrow 52. When the outer end of the arm 36 meets the trigger finger 38 it is retained and the arm 36 causes the balance-wheel 27 to rotate in the opposite direction to the turntable 4, as shown by the arrow 53, until the branch 27a of the balance-wheel bears on the abutment 30.

In this position (see FIG. 3) the finger 31 of the balance-wheel 27 releases the finger 33 of the turntable 16 which was bearing on it and the finger 32 of the balance-wheel 27 moves in front of the path of the fingers 33. The force accumulator member 19 causes the turntable 16 to rotate until one of the fingers 33 on it comes to rest against the finger 32. The turntable 16 has then rotated through 1/24 turn, i.e. a half-increment.

The outside part of the arm 36 having passed over the trigger abutment 38, the balance-wheel 27 is released and the spring 34 causes it to rotate in the direction opposite the arrow 53 until it bears against the abutment 29. The finger 32 releases the finger 33 of the turntable 16 which was bearing on it and the next finger 33 of the turntable 16 bears against the finger 31 of the balance-wheel 27.

During this reciprocating movement of the balance-wheel 27 the force accumulator member 19 has caused the turntable 16 to rotate through 1/12 turn, i.e. one increment, so that the next through-passage 22 of the turntable 16 is aligned with the through-passage 23 of the turntable 4.

The processing as described above can then be applied to the wafers in the through-passages now aligned with the through-orifices 23 and 24 of the turntable 4.

The selector device 1 enables the various wafers 21a, 22a to be subjected to different processes associated with the various positions of the turntable 16.

In one possible embodiment the motor 11 can move the selector device 1 into a position that can be sensed by the sensor 40 such that the outer part of the trigger arm 36 is facing the trigger finger 38 carried by the vertical shaft 37. In this position the electric actuator member 39 is activated to cause the trigger finger 38 to operate on the arm 36 to turn the balance-wheel 27 in the direction of the arrow 53, as previously mentioned, and the actuator member 39 is activated in order to retract the trigger finger 38 so that the balance-wheel 27 turns in the direction opposite the arrow 53, as previously described. During this reciprocating movement of the balance-wheel 27 the turntable 16 rotates through 1/12 turn, i.e. one increment, as previously described.

In the embodiment previously described the selector device 1 has to rotate by one turn to rotate the turntable 16 by 1/12 turn. In this second embodiment the selector device remains stationary. By having the trigger finger 38 operate on the trigger arm 36 connected to the balance-wheel 27, the turntable 16 can be caused to advance by 1/12 turn as many times in succession as required.

To off-load the wafers 21a and 22a after processing and to load other wafers the following procedure can be adopted:

The front door of the enclosure 2 (not shown in FIG. 1) is opened and the selector device 1 is turned by hand to free the lower part of the columns 9 from the notches 8 in the horizontal plate 5. The selector device 1 is then removed manually from the enclosure 2 and put down on a worksurface, for example.

The cover 48 is lifted off. The wafers 21a and 22a are removed from the through-passages 21 and 22 of the turntable 16, possibly by rotating the turntable by operating the trigger arm 36 manually.

New wafers 21a and 22a are placed in the through-passages 21 and 22 of the turntable 16.

The knob 16 is turned to retension the spiral spring of the force accumulator device 19.

The positions of the new wafers relative to through-passages 23 and 24 are marked. The cover 48 is replaced.

The connector device 1 is picked up and replaced in the enclosure 2, rotating it to engage with the lower ends of the columns 9.

The selector device 1 is ready for processing the new wafers carried by its turntable 16, in the manner previously described.

The present invention is evidently not limited to the example described above. In particular the number, arrangement and shape of the through-passages of the turntable 16 can be different. The diameters of the turntables 4 and 16 can be in a different ratio. The processing station constituted by the through-passages 23 and 24 of the turntable 4 can be a different shape.

There is claimed:

1. A selector device for moving at least one object to a processing station, comprising:
   an object-holder rotatably mounted on a support, the object holder comprising object receiving areas for receiving objects to be processed, and the object-holder being adapted to move the object receiving areas to the processing station during use;
   a force accumulator member connected to and adapted to rotate the object-holder during use;
   an incrementer mechanism comprising a stopping mechanism on the support;
   a plurality of abutments on the object-holder that are operatively associated with the receiving areas, the stopping mechanism being adapted to cooperate with the abutments to hold the object-holder at positions such that the receiving areas are selectively located at the processing station during use; and
   a trigger mechanism adapted to operate in association with the incrementer mechanism so that the stopping mechanism passes selectively from one abutment to a next abutment after rotation of the object-holder by the force accumulator member.

2. The device of claim 1, wherein the incrementer mechanism comprises an escapement with pallets which comprises:
   a balance-wheel pivotally mounted on the support; and
   fingers adapted to cooperate alternately with the abutments of the object-holder.

3. The device of claim 2, further comprising a spring adapted to operate on the balance-wheel in order to move one of the fingers in front of one of the abutments of the object-holder, the trigger mechanism operating against the spring in order to move the other finger in front of another abutment of the object-holder during use.

4. The device of claim 1 where the object-holder comprises a turntable and the abutments are peripherally disposed on the turntable.

5. The device of claim 1 wherein the force accumulator member comprises a spiral-spring connected rotational tensioner.

6. The device of claim 1 wherein the support is removably mounted on a frame.

7. The device of claim 6 wherein the support and the frame comprise rotational couplers.

8. The device of claim 1 wherein the support is rotatably mounted on a frame and the device comprises a driver for rotating the support during use.

9. The device of claim 8 wherein the support is rotatably mounted on the frame by a rotational driver.

10. The device of claim 1 wherein the trigger mechanism comprises a mobile finger adapted to move along a path of a part of arm and rotate the arm when the support rotates during use.

11. The device of claim 1 further comprising a removable cover mounted on the support and enclosing the incrementer mechanism, the trigger mechanism having a part which extends through the cover.

12. The device of claim 1 wherein at the processing station the support has at least one through-passage and the object-holder has at least one corresponding through-passage in the receiving areas.

13. The device of claim 1 wherein the object-holder and the support comprise respective turntables, the turntables having eccentric parallel axes.

14. The device of claim 1 further comprising an enclosure with a frame that supports the device.

15. The device of claim 14 wherein the trigger mechanism has a part which extends through the wall of the enclosure.

16. The device of claim 1, further defined as a device for moving a substrate to a processing station.

17. A device for moving at least one substrate to a processing station comprising:
   an object-holder rotatably mounted on a support, the object holder comprising object receiving areas for receiving objects to be processed, and the object-holder being adapted to move the object receiving areas to the processing station during use;
   a force accumulator member connected to and adapted to rotate the object-holder during use;
   an incrementer mechanism comprising a stopping mechanism on the support;
   a plurality of abutments on the object-holder that are operatively associated with the receiving areas, the stopping mechanism being adapted to cooperate with the abutments to hold the object-holder at positions such that the receiving areas are selectively located at the processing station during use; and
   a trigger mechanism adapted to operate in association with the incrementer mechanism so that the stopping mechanism passes selectively from one abutment to a next abutment after rotation of the object-holder by the force accumulator member.

18. The device of claim 17 wherein the object-holder comprises a turntable and the abutments are peripherally disposed on the turntable.

19. The device of claim 17 wherein the support is rotatably mounted on a frame and the device comprises a driver for rotating the support.

20. A method of moving at least one object to a processing station, comprising:
   obtaining a selector device for moving at least one object to a processing station, comprising:
      an object-holder rotatably mounted on a support, the object holder comprising object receiving areas for receiving objects to be processed, and the object-holder being adapted to move the object receiving areas to the processing station during use;
      a force accumulator member connected to and adapted to rotate the object-holder during use;
      an incrementer mechanism comprising a stopping mechanism on the support;
      a plurality of abutments on the object-holder that are operatively associated with the receiving areas, the stopping mechanism being adapted to cooperate with the abutments to hold the object-holder at positions such that the receiving areas are selectively located at the processing station during use; and
      a trigger mechanism adapted to operate in association with the incrementer mechanism so that the stopping mechanism passes selectively from one abutment to a next abutment after rotation of the object-holder by the force accumulator member;
   placing at least one object on at least one of the object-holders; and
   operating the selector device to move the object to a processing station.

* * * * *

UNITED STATES PATENT AND TRADEMARK OFFICE
CERTIFICATE OF CORRECTION

PATENT NO. : 5,400,892
DATED : March 28, 1995
INVENTOR(S) : Alain Gentric

It is certified that error appears in the above-identified patent and that said Letters Patent is hereby corrected as shown below:

In Claim 10, col. 7, ln. 61 - Insert --an-- between "of" and "arm".

Signed and Sealed this

Twenty-third Day of May, 1995

Attest:

BRUCE LEHMAN

Attesting Officer     Commissioner of Patents and Trademarks